(12) United States Patent
Hoffman

(10) Patent No.: US 6,812,674 B2
(45) Date of Patent: Nov. 2, 2004

(54) APPARATUS AND METHOD FOR TESTING BATTERY CONDITION

(76) Inventor: Gary Hoffman, 32 Phyllis Pl., Randolph, NJ (US) 07869

( * ) Notice: Subject to any disclaimer, the term of this patent is extended or adjusted under 35 U.S.C. 154(b) by 0 days.

(21) Appl. No.: 10/081,630

(22) Filed: Feb. 21, 2002

(65) Prior Publication Data

US 2002/0121901 A1 Sep. 5, 2002

Related U.S. Application Data

(60) Provisional application No. 60/271,472, filed on Feb. 26, 2001.

(51) Int. Cl.[7] .................................................. H02J 7/04
(52) U.S. Cl. ........................................ 320/162; 320/137
(58) Field of Search ............................... 320/162, 137, 320/152, 157, 136, 164, 159, 161, 163, 165

(56) References Cited

U.S. PATENT DOCUMENTS 4,099,115 A * 7/1978 Watanabe .................... 323/314
5,898,234 A * 4/1999 Kitagawa ....................... 307/48

* cited by examiner

*Primary Examiner*—Lawrence Luk
(74) *Attorney, Agent, or Firm*—Henry I. Schanzer

(57) ABSTRACT

In circuits and systems embodying the invention the condition of a battery may be tested and monitored while the battery is supplying a load current to a load and without interrupting that operation. A selectively enabled switch causes a test current to selectively flow through the battery and a test resistor of known value. The voltage across the test resistor is sensed to determine the value of the test current. The voltage across the battery is measured under two conditions, with the test current and without the test current flowing through it. These measurements and knowing the value of the test current enable the internal resistance of the battery under test to be calculated and monitored.

23 Claims, 7 Drawing Sheets

US 6,812,674 B2

APPARATUS AND METHOD FOR TESTING BATTERY CONDITION

CROSS REFERENCE TO RELATED APPLICATIONS

This application claims priority from provisional patent application Ser. No. 60/271,472 for Battery Life Monitoring Device filed Feb. 26, 2001 by Gary R. Hoffman, the disclosure of which is incorporated herein by reference.

BACKGROUND OF THE INVENTION

This invention relates to a method and apparatus for monitoring selected electrical characteristics of a battery used to power an electrical system.

Batteries are used in many critical applications. For example, stationary storage batteries may be used to power equipment and components in electrical power generating and/or distribution substations. When used, the batteries must supply the needed current and power to operate circuits used to enable the orderly shut down or de-energization, (or even the re-energization and turn-on) of critical control circuits within the substation. It is therefore important that the battery be in a condition to supply the power needed to operate the system reliably. However, with the battery connected in circuit, it is difficult to determine the condition of the battery and/or whether it is at, or close to, a failure point. In the case of unmanned sites, such as a remote substation, skilled personnel may be routinely dispatched to the remote locations to check out the condition of these batteries. However, this is expensive and inefficient.

These batteries are "heavy duty" batteries and may be, for example, of the lead acid type, nickel cadmium type and/or any other suitable type. As a storage battery ages as a function of usage, care and temperature, electro-chemical changes take place within the battery and also at the connections to the battery. The electro-chemical changes may give rise to an increase in the resistance of the battery that may inhibit the battery from delivering the necessary current. Alternatively, the electro-chemical changes may give rise to an unwanted decrease (e.g., a short) in the resistance of the battery. It is therefore desirable and/or necessary to continuously monitor the resistance of the battery and/or the ability of the battery to provide the required power output to a load.

Some known techniques to measure battery resistance rely on the injection of AC currents into the battery for measuring both its absolute impedance and changes in the impedance of the battery. However, the circuitry needed to accurately measure the change in the impedance to a required degree of resolution renders these techniques prohibitively expensive in most applications.

These problems are overcome in circuits and systems embodying the invention.

SUMMARY OF THE INVENTION

In circuits and systems embodying the invention the condition of a battery, supplying a load current to a load, may be tested and monitored while the battery is connected to the load and without interrupting that operation. A selectively enabled switch causes a test current to selectively flow through the battery and a test resistor of known value. The voltage across the test resistor is sensed to determine the value of the test current. The voltage across the battery is measured under two conditions, with the test current and without the test current flowing through it. Making and processing these measurements and determining the value of the test current enable the internal resistance of the battery to be calculated at any point in time and to be monitored over time.

BRIEF DESCRIPTION OF THE DRAWINGS

In the accompanying drawings like reference characters denote like components.

DETAILED DESCRIPTION OF THE INVENTION

Figure 1:
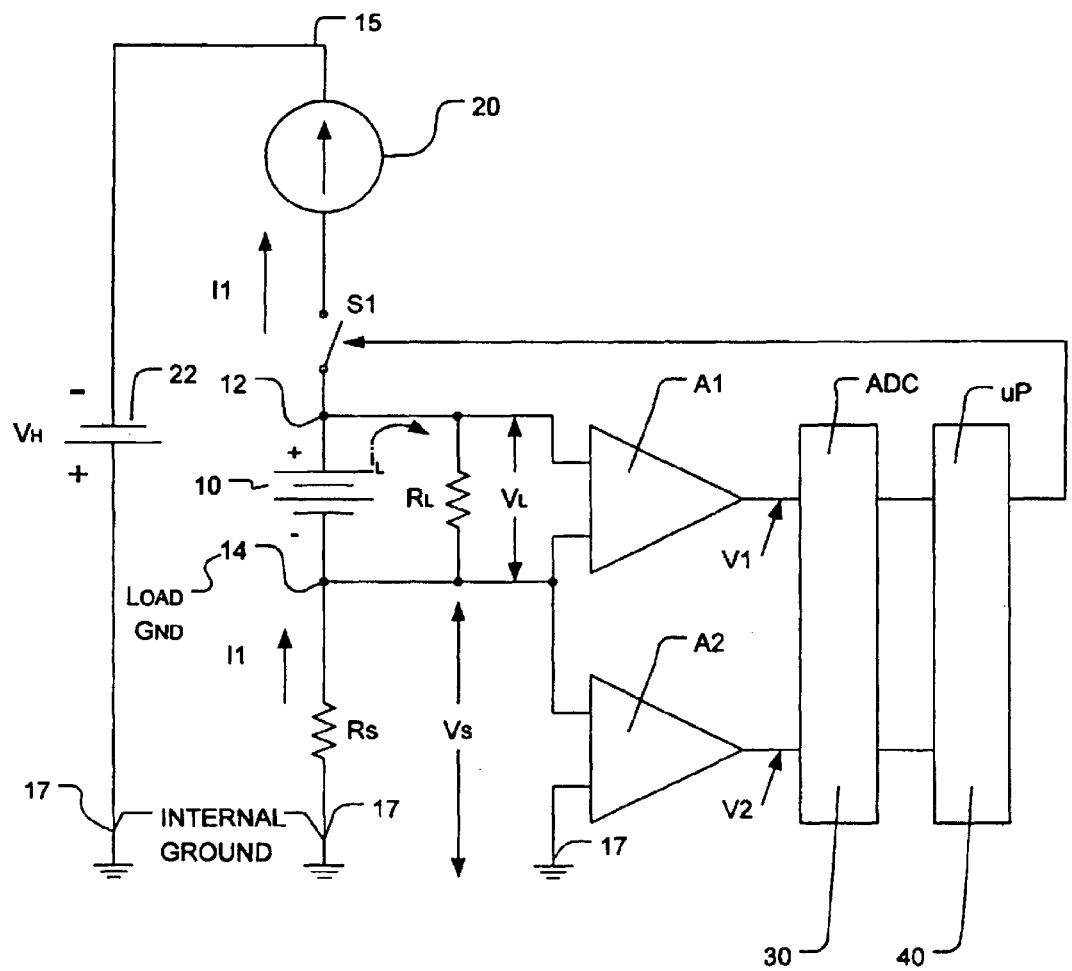
FIG. 1 is a simplified schematic diagram of a circuit embodying the invention.
Figure 1A:
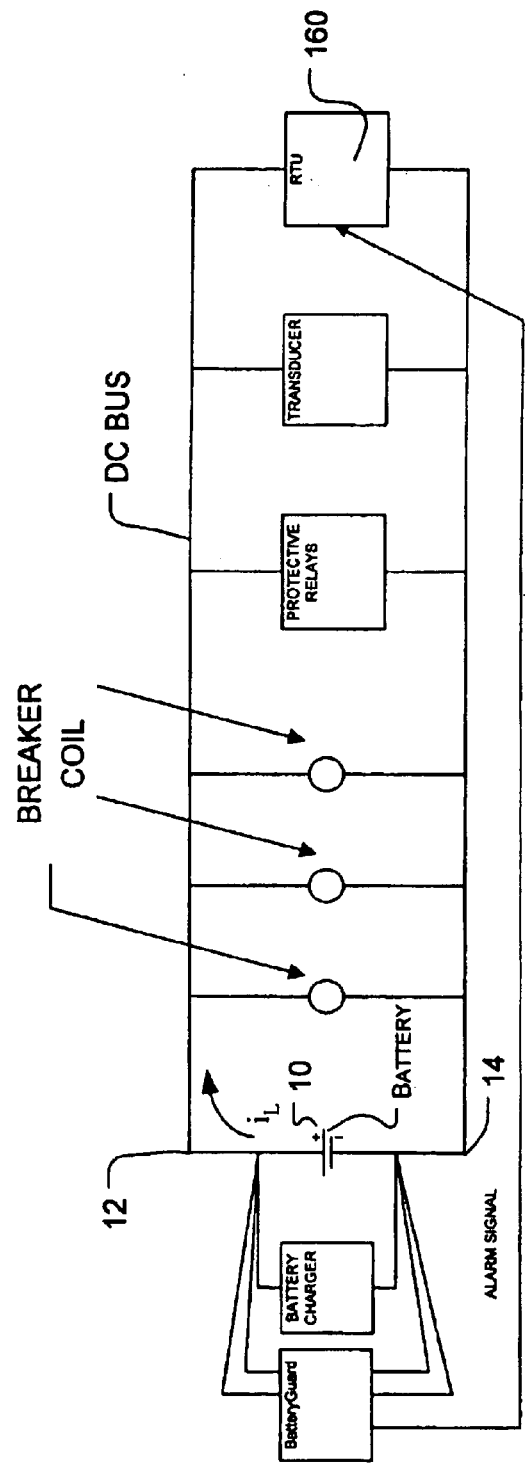
FIG. 1A is a block diagram of typical load components to be powered by a battery.

FIG. 1 is a simplified schematic diagram of a circuit embodying the invention. A Battery 10 which is intended to, supply the power to a load RL is connected between power terminals 12 and 14. Battery 10, whose condition is to be tested and monitored, represents the DC power supply used to power the load (e.g., RL) in the system (e.g., an electric power generating substation). Typically, battery 10 may be in the range of 12 to 250 volts. However, it should be understood that any battery of virtually any voltage value may be used in circuits embodying the invention. In FIG. 1, terminal 12 denotes the positive terminal of the battery supply system and terminal 14 represents the battery ground terminal. A load, RL, connected between terminal 12 and 14, is intended to represent all the diverse loads in the system powered by the battery 10. For ease of illustration RL is shown as a resistor; however RL, as shown in FIG. 1A may be a compound load with inductive and capacitive components, or an active load. By way of example, FIG. 1A shows a load (RL) which includes breaker coils, protective relays, a transducer, and a remote terminal unit (RTU),160, for communicating with a central/dispatch station. However, as already noted, any suitable load device may be included as part of the load to be powered by the battery. The battery 10 and the load RL form one loop in which the load current ,IL, flows, with terminal 14 defining the ground return (load ground) for all the components powered by battery 10.

Referring to FIG. 1, a first operational amplifier A1 is connected across RL and is designed to produce a voltage V1 indicative of the voltage VL developed across the load RL in parallel with the battery (10). Since it is necessary for battery 10 to be in a condition to supply the power to operate the load circuits connected across the battery, additional monitoring circuitry is coupled to battery 10 to test it and to ensure its fitness as further described below.

The battery testing circuitry includes a second loop for determining the condition of battery 10. The second loop includes circuitry for selectively injecting a DC test current into (or out of) battery 10. In FIG. 1, the second loop includes a current generator 20 for producing the test current (I1) which is connected via a switch S1 between terminal 12 and a terminal 15. It is noted that current generator 20 may be a sinking or sourcing current source (i.e., it may supply a current in the same direction as iL or in an opposite direction to iL). An auxiliary ("compliant") power supply 22, which may be a battery, providing a voltage denoted as "$V_H$", is shown connected at its negative terminal to terminal 15 and at its positive terminal to a terminal 17, which is defined as the internal ground return of the circuit. Note that power supply 22 may be a battery independent of source 10, or even an independent dc-to-dc converter operating from battery 10. Note that in the equivalent circuit of FIG. 1, current source 20 may include battery 22. However battery 22 is explicitly shown, in addition to current source 20, to indicate that an extra battery may be used to practice the invention. A series resistor Rs is connected between internal ground terminal 17 and terminal 14 (load ground). Switch S1 is a selectively enabled switch whose turn-on and turn-off may be controlled by a microprocessor 40. When switch S1 is closed, a loop (or test) current I1 flows from internal ground 17 through resistor Rs through battery 10, through the current source 20 and then through battery 22 back to internal ground terminal 17.

The test current I1 through Rs causes a voltage Vs to be developed across resistor Rs. The voltage across Rs is sensed by an operational amplifier A2 which produces a voltage V2 corresponding to Vs. The outputs (V1 and V2) of amplifiers A1 and A2 are fed to an analog to digital converter (ADC) 30 which converts the analog values of voltages V1 and V2 to digital values, with ADC 30 then supplying corresponding signals to a microprocessor 40 for processing.

Rs may be selected to have a relatively well defined ohmic value and its variations with temperature may also be relatively well defined. Thus, when the switch S1 is closed and a current flows through Rs producing a voltage V2, the value of the test current I1 can be ascertained to a great degree of accuracy, since I1=V2/Rs. For ease of explanation, and in the discussion to follow, it will be assumed that V1 is equal to VL and V2 is equal to Vs. Note that current source 20 can be made to be a relatively "stiff" current source whose current amplitude is relatively well defined, whereby measuring V2 indicates the value of Rs as well as the value of the test current.

In the operation of the system, the value of the voltage across RL, which is also equal to the battery 10 voltage, can be measured with S1 open and the information supplied to, and stored in a microprocessor (e.g., 40 in FIGS. 2–5) or other suitable processing device. Then, the switch S1 is closed and the voltage across the battery is again measured with the infusion of a test current I1. This value of voltage is also supplied to and stored in the processor. With S1 closed, the voltage across battery 10 is now a function of the current I1 plus the current IL flowing through the battery. The change (increase or decrease) in voltage across the battery 10 with S1 closed yields the value of the battery resistance (Rbattery), as set forth in eq. 1 below:

$$R\text{battery}=[V1(\text{with } S1 \text{ closed})-V1(\text{with } S1 \text{ open})]/[I1];\quad\text{eq. 1}$$

where I1=V2/Rs

The values of battery voltage (V1) with and without the test current injected into (or out of) the battery and the value of V2 can be periodically (or selectively or programmably) measured and fed to the microprocessor 40 to enable the dynamic value of Rbattery to be periodically or selectively calculated. The microprocessor 40 is programmed to perform all the calculations and is also programmed to sense whether any changes in Rbattery exceed predetermined boundary values. That is, V1 and V2 are sensed and I1 is determined, since Rs is known. Then, the value of Rbattery is calculated using equation 1. Following which, the calculated values of Rbattery may be compared to a predetermined and/or known range of permissible or acceptable values of Rbattery. The predetermined range of permissible values of Rbattery may be prestored or preprogrammed in a memory (not shown) in processor 40 or in a memory such as EEROM 403 shown in FIG. 4. If any of the permissible boundary values for Rbattery are exceeded, the microprocessor generates a warning and an alarm may be sounded (see 409 in FIG. 4). Determining the value of Rbattery is central to the invention because its value is indicative of the current (and power) the battery can deliver. It should be noted that in accordance with the invention the value of Rbattery may be calculated and stored and/or plotted over time so that the values of Rbattery may be calculated at any time and the changes in Rbattery over time may also be monitored, noted and recorded. This enables the determination of the amount of changes in Rbattery and the direction of the change and rate of change in Rbattery over time.

It is significant that, in accordance with the invention, the battery resistance can be measured using a relatively simple DC circuit and that switch S1 can be opened and closed without substantially affecting the operation of the battery 10 feeding the load RL, and hence the operation of the load. By superimposing a test current (in phase and/or out of phase) on the load current being supplied by a battery 10 and by using two different current carrying loops, one for the load current and one for the test current, the condition (e.g., the internal battery resistance) of the battery 10 can be determined. Note also that different ground returns may be used for the battery supplied load system and for the test current loop whereby the load is essentially isolated from the test current generating network.

The microprocessor 40 may be programmed to determine the rate of change of the battery resistance (e.g., is it increasing or decreasing over time and to compare the sensed and calculated values versus historical resistance data. The microprocessor 40 may be preprogrammed to include information regarding permissible changes in battery resistance as a function of the load (e.g., current drawn) imposed on the battery, and/or as a function of temperature and time. The microprocessor may then compare the rate of change in resistance against preprogrammed set points. Should the value of Rbattery and/or the rate of change in battery resistance be equal to or greater than certain preprogrammed values the microprocessor can generate an alarm signal.

Figure 2:
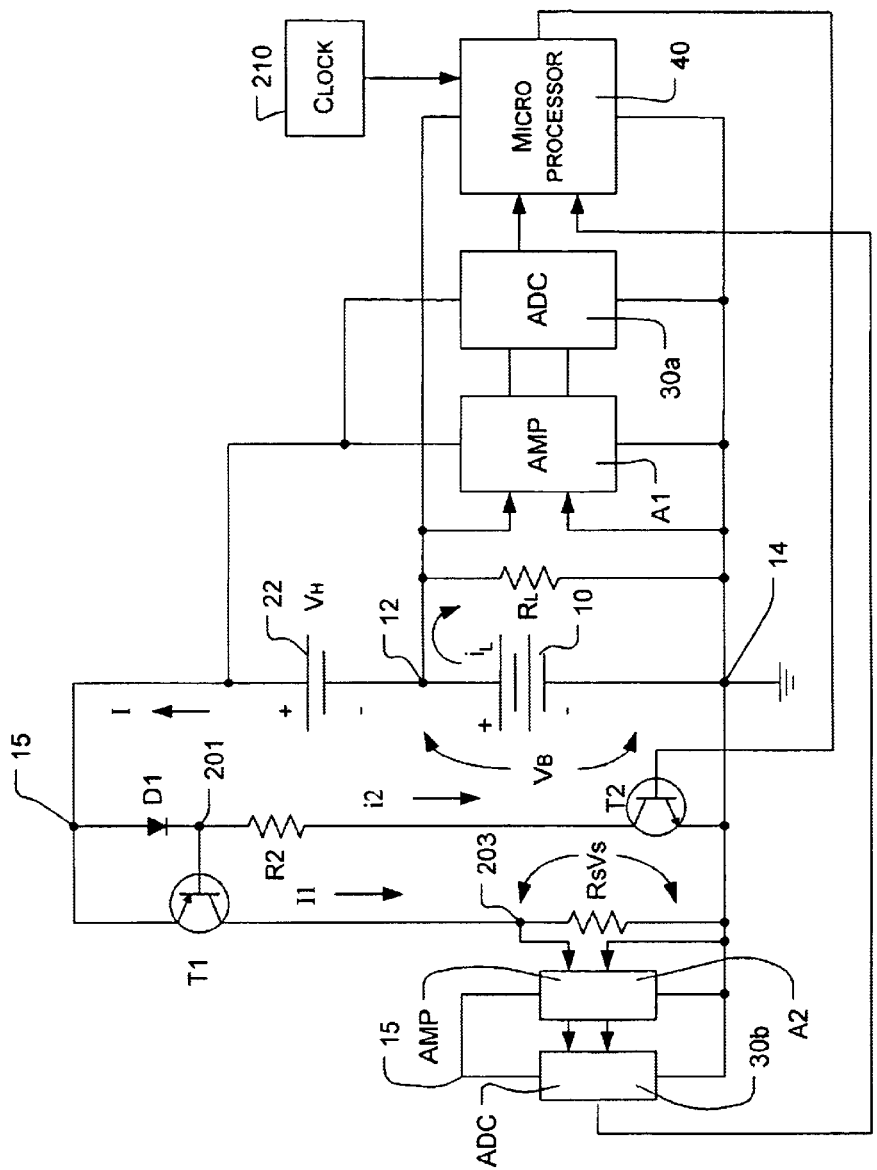
FIG. 2 is a simplified schematic diagram of another circuit embodying the invention.

Referring to FIG. 2, the "main" battery 10, whose voltage is identified as VB, is connected between terminals 14 and 12, and a compliance power supply 22, having a voltage VH, is shown as a battery 22 having its negative terminal connected to the positive terminal of battery 10, at terminal 12 and its positive terminal connected to terminal 15. The switch S1 and the current source 20, shown in FIG. 1, are implemented in the circuit of FIG. 2 by a circuit which includes bipolar transistors T1 and T2, diode D1 and a resistor R2. Transistor T2 is shown as an NPN bipolar transistor with its emitter connected to terminal 14 and its base coupled to microprocessor 40 which selectively supplies turn-on and turn-off signals to T2. The collector of T2 is connected via a resistor R2 to a node 201 to which is connected the base of a PNP transistor T1 and the cathode of a diode D1. The emitter of T2 and the anode of D1 are shown connected to terminal 15. The collector of T1 is connected to node 203 and a resistor Rs is connected between node 203 and terminal 14. When transistor T2 is turned on it pulls a current i2 out of node 201 causing transistor T1 to turn on and to supply a current I1 into resistor Rs. The current (I) drawn out of the battery 22 and battery 10 is equal to the sum of I1 and i2. In practice i2 may be made much smaller than I1 whereby the current I1 may be assumed to be equal to I. As is the case of the circuit shown in FIG. 1, the voltage developed across Rs is applied to an operational amplifier A2 whose output is applied to an ADC 30b whose output, in turn, is applied to microprocessor 40. Concurrently, the voltage across the battery 10 is applied to an operational amplifier A1 whose output is applied to an ADC 30a whose output in turn is applied to microprocessor 40, which functions as discussed above. In FIG. 2, the operating potential to amplifiers A1, A2 and ADC 30a and ADC 30b is the voltage developed between terminal 15 (the most positive potential) and terminal 14 (functioning as system ground. Note that in FIGS. 1 and 2 the current I (or I1) drawn by the auxiliary loop is in a direction to add to the load current iL drawn from battery 10. Thus currents I and iL flow in the same direction through the battery 10.

Note also that in FIGS. 1 and 2 the auxiliary power source 22 may be a battery whose value is just a few volts. For example, if the battery 10 voltage is 12 volts, the value of VH could be any voltage greater than approximately 1 volt. A clock circuit 210 is shown connected to processor 40 to supply timing and clocking signals to the processor 40. Similarly, a clock signal 310 is shown connected to microprocessor 40 in FIG. 3 and a clock circuit 310a is shown connected to processor 40 in FIG. 3A.

Figure 3:
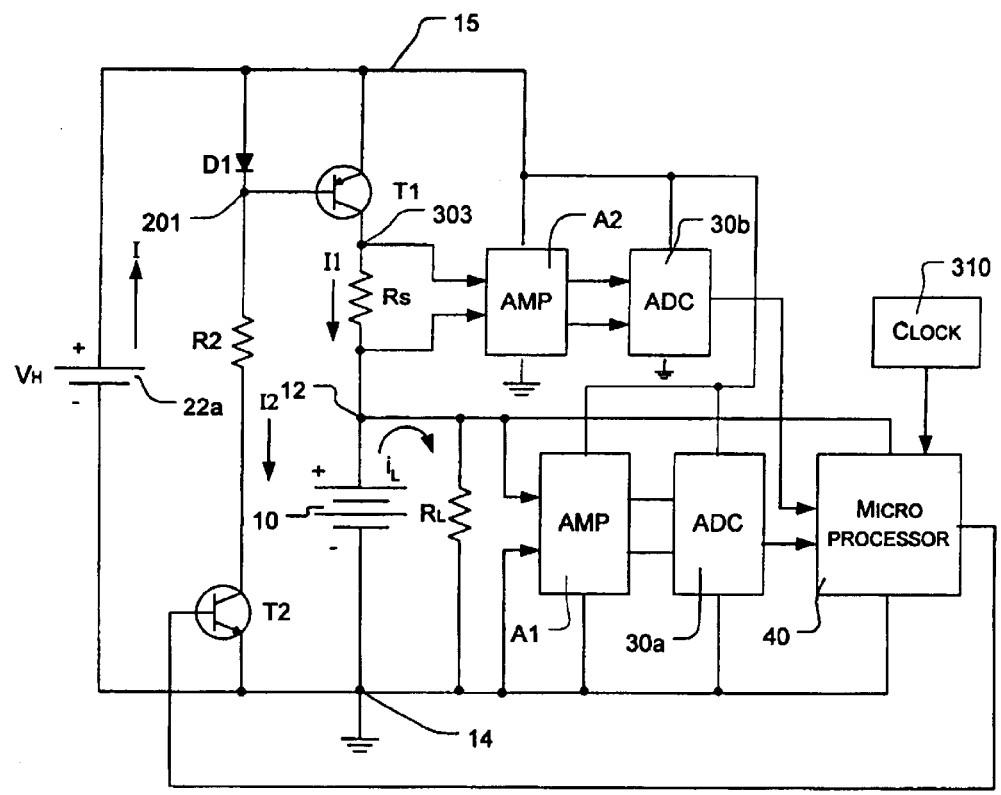
FIGS. 3 and 3A are other schematic diagrams of circuits embodying the invention.

Referring to FIG. 3, as before, the load powering battery 10 connected between terminals 14 and 12 supplies the load current iL to the load RL. The battery 10 is tested by injecting a test current I1, supplied from a compliance battery 22a, into battery 10. The current I1 is injected into the battery 10 in a direction opposite to the current iL drawn from battery 10 by the load RL. In FIG. 3, the "compliant power supply" 22a is shown with its most negative terminal connected to terminal 14 and its most positive terminal connected to terminal 15. In FIG. 3 transistors T1 and T2 function in a similar manner to that described for FIG. 2. However, in FIG. 3 the collector of T1 is connected to node 303 and resistor Rs is connected between node 303 and terminal 12 to which is connected the positive terminal of battery 10. When transistor T1 is turned on a current I1 is passed through Rs and is injected into battery 10. In FIG. 3, the voltage VH of source 22a must exceed the voltage of battery 10 plus the voltage drop across Rs (i.e., Vs); where Vs or V2 is equal to I1×Rs.

Figure 3A:
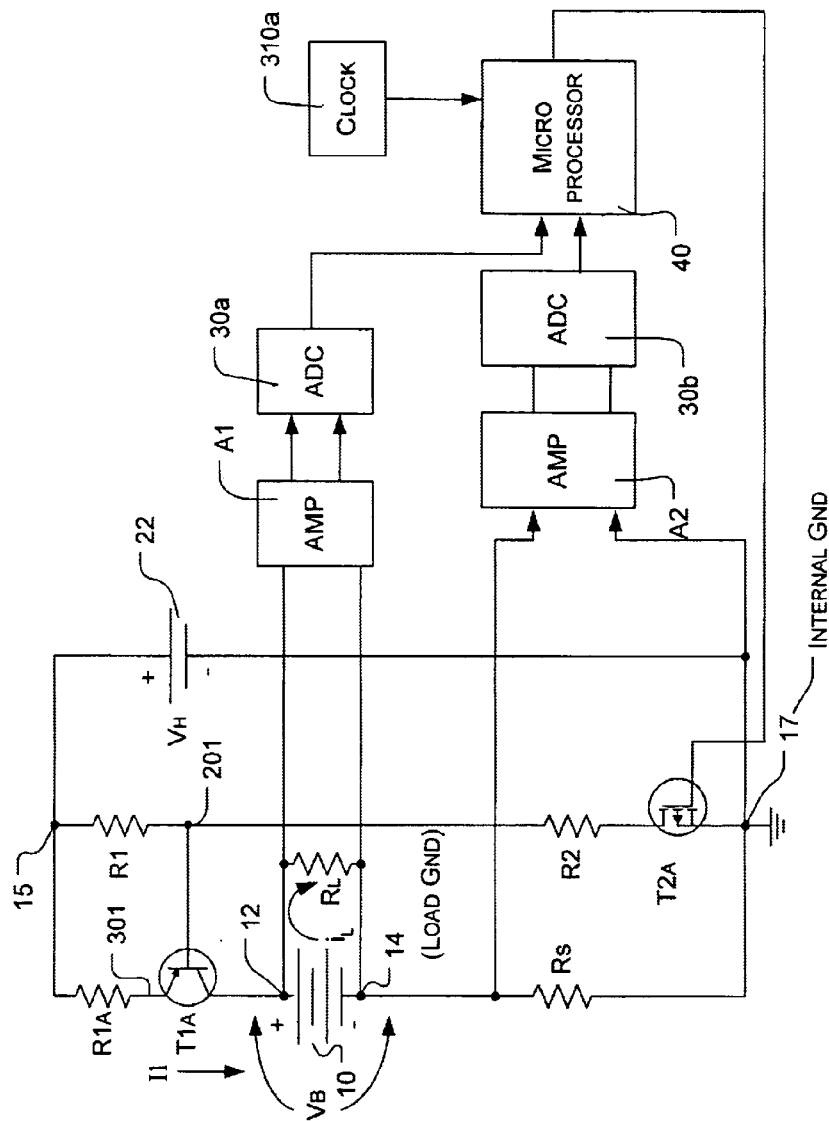

The circuit of FIG. 3 may be modified as shown in FIG. 3A. In the embodiment of FIG. 3A, the battery 10 is connected between terminals 12 and 14 and the battery 22 is connected between terminal 17 and 15. The circuitry for supplying a test current includes a resistor R1A connected between terminals 15 and 301. The emitter to collector path of a transistor T1A is connected between terminals 301 and 12 and a resistor Rs is connected between terminals 14 and 17. Transistor T1A is turned on and off by means of a transistor T2A having its conduction path connected in series with a resistor R2 between terminals 17 and 201. A biasing resistor R1 is connected between terminals 201 and 15. Transistor T1A is shown to be a PNP bipolar transistor; but transistor T1A could be any other type of suitable transistor such as a metal oxide semiconductor (MOS) transistor. Likewise, transistor T2A is shown to be an N-channel MOS field effect transistor (MOSFET); however as indicated in the other figures this transistor may be a bipolar transistor or any other suitable switching device.

In the operation of the circuit of FIG. 3A, whenever the microprocessor 40 supplies a positive going turn-on signal to the gate of transistor T2A, T2A is turned-on and pulls current out of node 201 turning on transistor T1A which then supplies a test current I1 into the battery 10 and via Rs to terminal 17. In this circuit the value of the battery 10 voltage is measured by means of amplifier A1 for two signal conditions: (a) with I1 flowing; and (b) without I1 flowing. Concurrently, the value of the voltage across Rs is measured by means of amplifier A2 to determine the value of the test current I1 injected into battery 10. The outputs of A1 and A2 are supplied to processor 40 which is set up (programmed) to calculate the value of Rbattery. The value of Rbattery may then be compared to acceptable values of Rbattery stored in memory.

Figure 4:
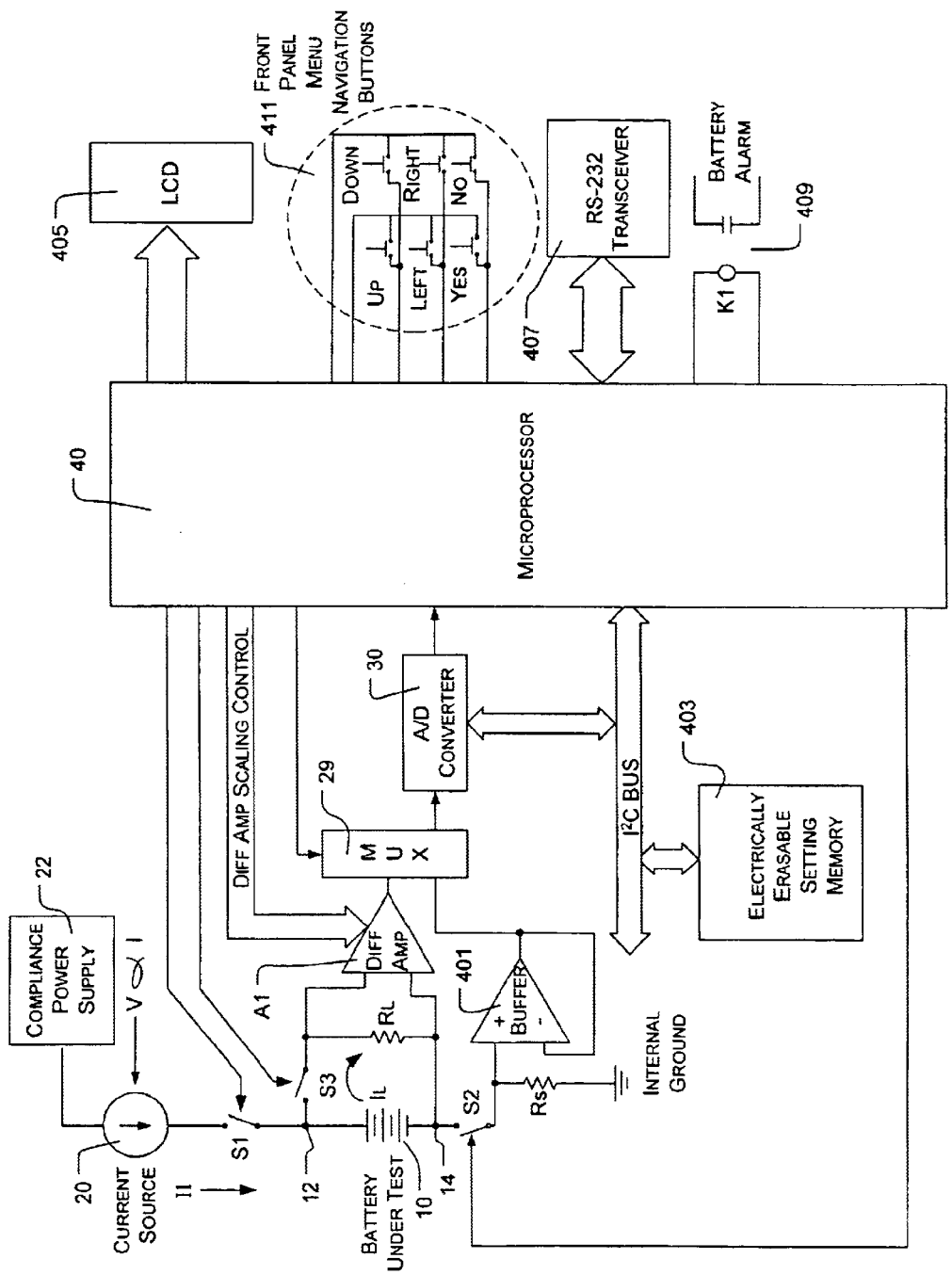
FIG. 4 is a block diagram of a system embodying the invention.

FIG. 4 shows that the battery 10 under test may be selectively connected to the load, RL, via a switch S3 to form the load current supplying loop. The "test" current injecting loop includes the "compliant" power supply 22 connected in series with current source 20 and via a switch S1 to terminal 12 of battery 10. The series resistor Rs is connected via a switch S2 to terminal 14 of battery 10. The turn-on and turn-off of these switches (S1, S2) is controlled by the microprocessor 40 which determines if and when these switches are turned-on and off. In FIG. 4, the voltage across Rs is sensed by a buffer amplifier 401 (which corresponds functionally to amp A2 in FIGS. 1–3) whose output is connected to a multiplexer (MUX) 29 whose output(s) is, or are, coupled to A/D converter (ADC) 30. The microprocessor may also be programmed to control the scaling of amplifier A1 whose output is fed to MUX 29 whose output is applied to ADC 30 Scaling of the input signals to the amplifiers may be needed to ensure that the amplifiers can respond to the full range of the input signals. Note that the output of ADC 30 is fed to microprocessor 40 for processing, as discussed above. FIG. 4 shows an electrically erasable memory (EEROM) 403 for storing information including information pertaining to selected characteristics of battery 10 and its resistance. Note that any suitable RAM or ROM could also be used instead of EEROM 403.

As discussed above, in the operation of the circuit, values (V1) of battery voltage 10 and the voltage (V2) across Rs are measured with: (a) I1 flowing for which switches S1, S2 and S3 are closed; and (b) without I1 flowing for which 33 is closed but S1 and/or S2 are open. The measurements are fed to the processor 40 which then calculates values of Rbattery. The information stored in the memory may then be compared to the measured and calculated values of Rbattery and then may be processed by microprocessor 40. The different values of Rbattery, as Rbattery varies over time, may be stored in memory (e.g., EEROM 403 and/or any other memory located in processor 40) to enable the continuous monitoring of the changes in Rbattery over time and the rate of change of Rbattery.

FIG. 4 also shows that the microprocessor 40 may activate a liquid crystal display (LCD) 405 which may be located within a substation or at a remote site. Likewise, the processor may generate signals transmitted via a transceiver 407 to an RTU or to any other monitoring device located within the same substation as the battery under test or to a central or manned station. Thus, values of Rbattery and associated changes, may be monitored at a local substation or be transmitted to a remote (e.g., central) power station. In addition, the processor 40 may generate signals for activating an alarm 409. Furthermore, processor 40 may be responsive to external switches 411 located on a control panel (not shown).

The battery 10 and the voltage and resistance sensing circuitry are highly suitable for use in an electrical power generation substation and or in a substation for distributing power. However, it should be understood that any "main" battery, wherever located and however used, may be monitored in accordance with the invention. A current may be injected into or drawn out of the battery under test to determine the value of the battery resistance.

Figure 5:
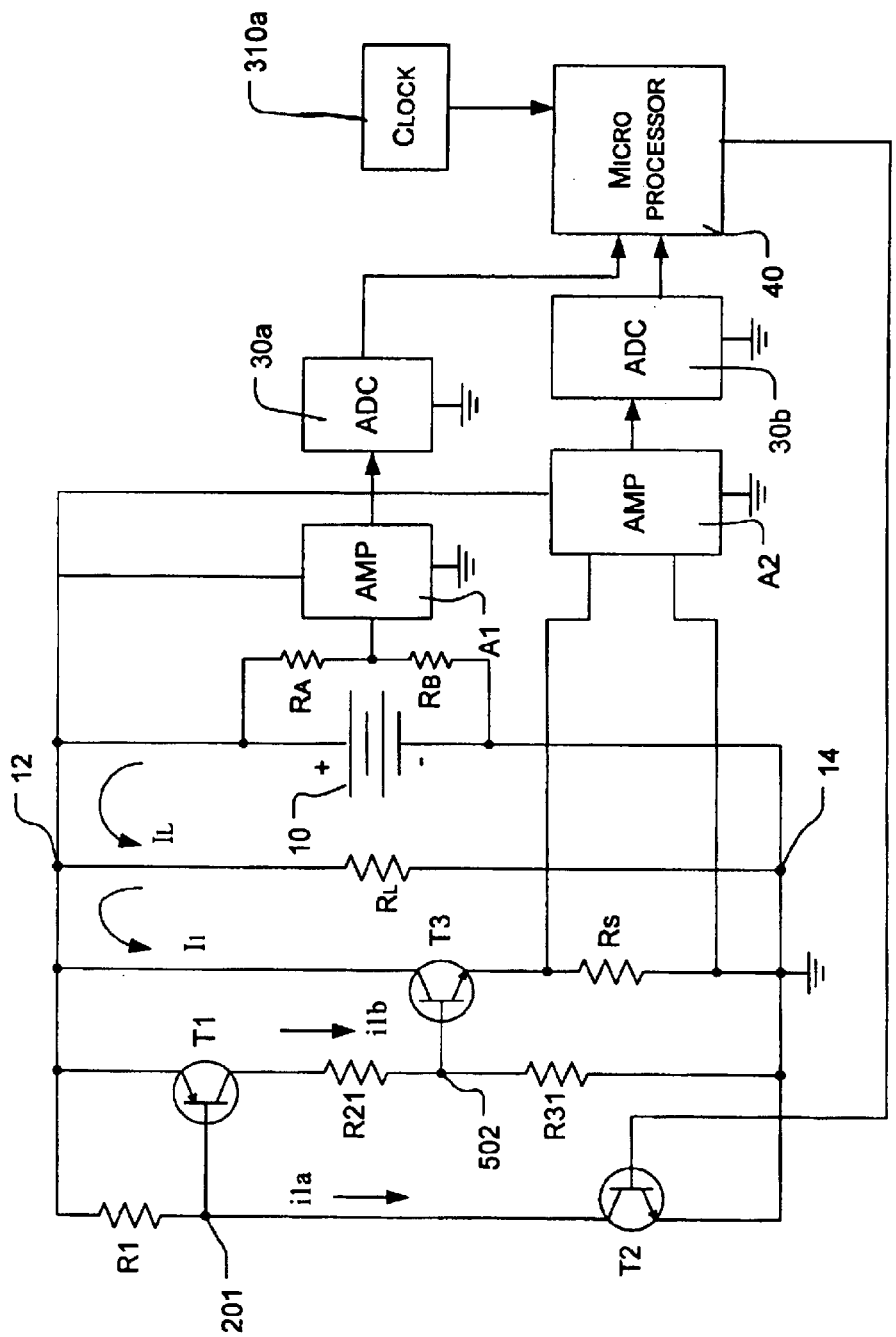
FIG. 5 is another diagram of a circuit embodying the invention using a single battery.

Referring to FIG. 5, the battery 10 connected between power terminals 12 and 14 supplies the load current IL to a load RL also connected between terminals 12 and 14. The battery voltage is sensed by means of amplifier A1 which then supplies a corresponding signal to ADC 30a which in turn supplies a corresponding signal to the processor 40. In FIG. 5 there is shown a divider network comprised of resistors RA and RB connected in series across battery 10 and the input to amplifier A1 is derived from a point along the divider network. RA and RB may be equal to each other or may be selected to produce any suitable divider (scaling) ratio for the input to amplifier A1. In FIG. 5 where a single battery is used the input to amplifier A1 is scaled down to enable A1 to sense the full range of battery 10 voltage changes. Thus, the value of the battery voltage for any given load condition may be determined. As discussed above, a test current (e.g., I1) may be selectively (or periodically) drawn from the battery. In the circuit of FIG. 5, the additional test current is drawn by means of switching circuitry which includes a transistor T2 which is turned on and off by processor 40 supplying a turn-on or turn off signal to the base of T2. When T2 is turned on, it pulls a current (i1a) out of the base of transistor T1 which then supplies a current i1b into a node 502. A ground return resistor R31 is connected between node 502 and ground terminal 14. An emitter follower transistor T3 is connected at its base to node 502 at its collector to terminal 12 and at its emitter to one end of a resistor Rs. The other end of resistor Rs is connected to terminal 14. Resistor Rs may be selected to have a predetermined known value whose characteristics as a function of temperature (and time) are known. When a current flows into node 502 transistor T3 multiplies the current and conducts a current identified as I1 and causes that current to flow through Rs to ground terminal 14. The voltage developed across Rs is sensed by amplifier A2 which then supplies a corresponding voltage to ADC 30b which then supplies a corresponding signal to processor 40. Since the value of Rs is known the value of I1 may be determined since I1 is approximately equal to [V2]/Rs. Since the current I1 is made much larger than i1a and i1b, it may be assumed that when the battery condition testing switch is closed (i.e., T1, T2, and T3 are enabled) the test current is essentially equal to I1. The battery 10 voltage is measured for the condition when the testing switch is closed and I1 flows and for the condition when the switch is open and I1 does not flow. This enables the microprocessor 40 to calculate the internal battery resistance, Rbattery, as discussed above. The calculation for Rbattery can be made based on the measurement of battery voltage and the voltage across Rs. The measurements and values obtained can be compared to pre-established acceptable values previously stored and programmed in memory in processor 40 (or in another part of the sytem). An alert may be given whenever Rbattery falls outside an acceptable range.

Thus, the combination of transistors T1, T2 and T3 function as a switch and a current source supplying a current into resistor Rs. As above, transistors T1, T2 and T3 are shown as bipolar transistors but suitable MOSFETs may be substituted.

In accordance with the invention, the value of Rbattery may be monitored as it varies over time by periodically and/or programmably making the measurements described above. The calculated values of Rbattery may be continuously compared versus stored values in microprocessor 40 or they may be transmitted via transceiver (see FIG. 4) to a central tracking device. Then, whenever, a battery 10 being monitored shows signs of approaching failure or unacceptable weakening, steps can be taken to replace the battery (or possibly recharge it) to ensure continuous safer operation of the system. Thus, the battery under test may be located in an unmanned substation and information pertaining to the battery may be transmitted to a manned station to dispatch someone to repair/replace any defective battery.

What is claimed is:

1. In a system in which a load is connected across first and second power terminals of a battery, a circuit for sensing the condition of the battery comprising:
   a current source generating a first current;
   a resistor;
   a selectively enabled switch,
   means connecting the current source in series with the resistor, the selectively enabled switch, and the battery for selectively passing the first current through the resistor and the battery;
   means for sensing the voltage across the resistor; and
   means for sensing the voltage across the battery for the condition when the selectively enabled switch is open and for the condition when the selectively enabled switch is closed.

2. In the system as claimed in claim 1, wherein the voltage is sensed across the resistor to determine the amplitude of the first current.

3. In the system as claimed in claim 2, wherein the values of the voltages sensed across the battery when the selectively enabled switch is closed and then opened and the value of the voltage sensed across the resistor are for determining the value of the resistance of the battery.

4. In the system as claimed in claim 1, wherein the voltage sensed across the resistor is coupled to and wherein the voltage sensed across the battery is also coupled to the microprocessor circuitry and wherein the microprocessor circuitry is programmed to determine the value of the battery resistance.

5. In the system as claimed in claim 1, wherein the battery is a first battery for supplying power to the load, with a load current from the first battery flowing through the load within a first loop; and wherein the current source generating a first current includes a second power source for supplying said first current and wherein said first current flows through a second loop which includes the first battery and said second power source.

6. In the system as claimed in claim 5, wherein the first battery and the second power source are connected in series, with the first battery and the second power source poled so their voltages are adding.

7. In the system as claimed in claim 5, wherein the first battery and the second power source are connected in series, with the first battery and the second power source poled so their voltages are opposing.

8. In the system as claimed in claim 5, wherein the first battery, the second power source, the current source, the selectively enabled switch and the resistor are connected in series defining said second conductive loop for selectively passing said first current.

9. In the system as claimed in claim 8, wherein the first battery and the second power source are poled to conduct current in the same direction.

10. In the system as claimed in claim 8, wherein the first battery and the second power source are poled to conduct current in opposite directions.

11. In the system as claimed in claim 5, wherein the second power source is connected between the first power terminal and a third terminal, and wherein the resistor and the switch are connected in series between the third terminal and the second power terminal.

12. In the system as claimed in claim 1, wherein the current source generating said first current is a constant current source.

13. A system comprising:
a battery with first and second power terminals;
a load connected across said first and second power terminals with the battery supplying the power to the load,
a circuit for sensing the internal resistance of the battery comprising:
a current source for producing a first current;
a resistor;
a selectively enabled switch,
means connecting the current source in series with the resistor, the selectively enabled switch, and the battery for selectively passing the first current source current through the resistor and the battery; and
means for sensing the voltage across the battery for the condition when the selectively enabled switch is open and for the condition when the selectively enabled switch is closed.

14. In a system as claimed in claim 13 wherein the voltage sensed across the resistor is supplied to a microprocessor and wherein the voltages sensed across the battery are supplied to the microprocessor; and wherein the microprocessor is programmed to determine the value of the internal resistance of the battery on the basis of the sensed voltages.

15. In a system in which a load is connected across first and second power terminals of a battery whereby the battery supplies the load current to the load, a circuit for sensing the condition of the buttery comprising:
a resistor of known value;
a selectively enabled switch for selectively causing a test current to flow through the resistor and the battery,
means for sensing the voltage across the resistor; and
means for sensing the voltage across the battery for the condition when the selectively enabled switch is open and for the condition when the selectively enabled switch is closed.

16. In the system as claimed in claim 15 wherein the voltage is sensed across the resistor to determine the amplitude of the test current; and wherein the voltage is sensed across the battery for the condition when the selectively enabled switch is open and for the condition when the selectively enabled switch is closed for determining the value of the internal resistance of the battery.

17. In the system as claimed in claim 16, wherein the voltage sensed across the resistor and the voltage sensed across the battery are supplied to an analog-to-digital converter (ADC) and wherein the ADC produces output signals corresponding to the voltages sensed, and wherein these output signals from the ADC are supplied to a microprocessor for determining the value of the internal resistance of the battery.

18. In the system as claimed in claim 16 wherein the battery voltage is sensed by means of a voltage divider connected across the battery.

19. A method for monitoring the condition of a battery, having first and second power terminals across which a load is connected and to which the battery supplies a load current, comprising the steps of:
selectively causing a resistor of known value to be coupled to the battery for selectively causing a test current to flow through the resistor and the battery, in addition to the load current;
sensing the voltage across the resistor;
sensing the voltage across the battery for the condition when the load current and test current flow through the battery and for the condition when only the load current flows through the battery; and
calculating the value or the battery resistance.

20. The method for monitoring the condition of the battery as claimed in claim 19 further including memory means for storing acceptable battery parameters; and wherein the calculated values of battery resistance are compared against the stored acceptable parameters.

21. The method as claimed in claim 19 wherein the test current is selectively and continuously applied and wherein the voltage across the battery is selectively and continuously sensed and the battery resistance is selectively and continuously calculated and the calculated values are continuously compared to stored parameters to ensure that the calculated values lie within an acceptable range.

22. The method as claimed in claim 19 wherein the step of calculating the value of the battery resistance includes: (a) the step of using the voltage sensed across the resistor to determine the amplitude of the test current; and (b) the step of dividing the difference in the voltage sensed across the battery for the condition when the load current and test current flow through the battery and for the condition when only the load current flows through the battery by the test current to obtain the value of the battery resistance.

23. The method as claimed in claim 19 wherein calculating the value of the battery resistance includes the step of supplying the voltage sensed across the resistor and the voltage sensed across the battery to a microprocessor.

* * * * *